(12) United States Patent
Akiyama et al.

(10) Patent No.: US 8,268,403 B2
(45) Date of Patent: *Sep. 18, 2012

(54) METHOD FOR FORMING ORGANIC SILICA FILM, ORGANIC SILICA FILM, WIRING STRUCTURE, SEMICONDUCTOR DEVICE, AND COMPOSITION FOR FILM FORMATION

(75) Inventors: Masahiro Akiyama, Tsukuba (JP); Hisashi Nakagawa, Tsukuba (JP); Tatsuya Yamanaka, Yokkaichi (JP); Atsushi Shiota, Ushiku (JP); Takahiko Kurosawa, Tsukuba (JP)

(73) Assignee: JSR Corporation, Tokyo (JP)

( * ) Notice: Subject to any disclaimer, the term of this patent is extended or adjusted under 35 U.S.C. 154(b) by 1235 days.

This patent is subject to a terminal disclaimer.

(21) Appl. No.: 11/596,295

(22) PCT Filed: Apr. 28, 2005

(86) PCT No.: PCT/JP2005/008223
§ 371 (c)(1), (2), (4) Date: Apr. 30, 2007

(87) PCT Pub. No.: WO2005/108468
PCT Pub. Date: Nov. 17, 2005

(65) Prior Publication Data
US 2008/0268264 A1    Oct. 30, 2008

(30) Foreign Application Priority Data

May 11, 2004  (JP) ................................. 2004-141200
Feb. 25, 2005  (JP) ................................. 2005-050590

(51) Int. Cl.
*B05D 3/02* (2006.01)
(52) U.S. Cl. ........ 427/387; 427/493; 427/515; 428/336; 428/447; 428/448; 428/450
(58) Field of Classification Search .................. 427/387, 427/493, 515; 428/336, 447, 448, 450
See application file for complete search history.

(56) References Cited

U.S. PATENT DOCUMENTS

| | | | |
|---|---|---|---|
| 5,789,325 A | 8/1998 | Chandra et al. | 438/781 |
| 6,042,994 A | 3/2000 | Yang et al. | 430/296 |
| 6,204,201 B1 | 3/2001 | Ross | 438/778 |
| 6,204,202 B1 | 3/2001 | Leung et al. | 438/781 |
| 6,207,266 B1 | 3/2001 | Kanbara et al. | 428/323 |
| 6,225,238 B1 | 5/2001 | Wu | 438/778 |
| 6,239,042 B1 | 5/2001 | Sonego et al. | 438/778 |
| 6,274,515 B1 | 8/2001 | Hughes et al. | 438/780 |
| 6,323,253 B1 | 11/2001 | Bennington | 522/16 |
| 6,383,913 B1 | 5/2002 | Tsai et al. | 438/624 |
| 6,495,264 B2 | 12/2002 | Hayashi et al. | 428/447 |
| 6,599,635 B1 | 7/2003 | Mechtel et al. | 428/449 |
| 6,613,834 B2 | 9/2003 | Nakata et al. | 524/588 |
| 6,756,085 B2 * | 6/2004 | Waldfried et al. | 427/515 |
| 6,807,041 B2 | 10/2004 | Geiger et al. | 361/103 |
| 6,809,041 B2 | 10/2004 | Interrante et al. | 438/780 |
| 6,902,771 B2 | 6/2005 | Shiota et al. | 427/515 |
| 6,933,360 B2 | 8/2005 | Ko et al. | 528/30 |
| 6,958,525 B2 | 10/2005 | Nakata et al. | 257/642 |
| 7,026,053 B2 | 4/2006 | Shiota et al. | 428/447 |
| 7,128,976 B2 | 10/2006 | Hayashi et al. | 428/447 |
| 7,528,207 B2 | 5/2009 | Nakagawa et al. | 528/21 |
| 2001/0018129 A1 | 8/2001 | Shiota et al. | 428/447 |
| 2001/0033026 A1 * | 10/2001 | Nakata et al. | 257/759 |
| 2002/0064965 A1 | 5/2002 | Wu | 438/778 |
| 2002/0198353 A1 | 12/2002 | Chen et al. | 528/10 |
| 2003/0003288 A1 | 1/2003 | Nakata et al. | 428/304.4 |
| 2003/0104225 A1 | 6/2003 | Shiota et al. | 428/447 |
| 2003/0157340 A1 | 8/2003 | Shiota et al. | 428/446 |
| 2003/0207131 A1 | 11/2003 | Nakata et al. | 428/447 |
| 2004/0000715 A1 | 1/2004 | Interrante et al. | 257/758 |
| 2004/0007753 A1 | 1/2004 | Seki et al. | 257/443 |
| 2004/0058090 A1 | 3/2004 | Waldfried et al. | 427/558 |
| 2004/0109950 A1 | 6/2004 | Adams et al. | 427/387 |
| 2004/0180188 A1 | 9/2004 | Nakata et al. | 428/312.6 |
| 2005/0096415 A1 | 5/2005 | Akiyama et al. | 524/261 |
| 2005/0272220 A1 * | 12/2005 | Waldfried et al. | 438/400 |
| 2006/0006541 A1 | 1/2006 | Tsuchiya et al. | 257/759 |
| 2006/0024980 A1 | 2/2006 | Tsuchiya et al. | 438/789 |
| 2006/0063905 A1 | 3/2006 | Nakagawa et al. | 528/12 |
| 2006/0127587 A1 | 6/2006 | Kang et al. | 427/387 |
| 2006/0134336 A1 | 6/2006 | Nakagawa et al. | 427/387 |
| 2006/0210812 A1 | 9/2006 | Shiota | 428/447 |
| 2006/0275614 A1 | 12/2006 | Shiota | 428/447 |
| 2007/0015892 A1 | 1/2007 | Nakagawa et al. | 528/25 |
| 2007/0020467 A1 | 1/2007 | Nakagawa et al. | 428/447 |
| 2007/0021580 A1 | 1/2007 | Nakagawa et al. | 528/34 |

(Continued)

FOREIGN PATENT DOCUMENTS

EP    1 122 770    8/2001

(Continued)

OTHER PUBLICATIONS

Machine Translation of JP 2001-294809, Oct. 23, 2001.*
Mickler, Ed et al.,"A Charge Damage Study Using an Electron Beam Low k Treatment", Proceedings of the International Interconnect Conference, p. 190, 2004.
Miyajima, H. et al."The Application of Simultaneous eBbeam Cure Method for 65 nm Node Cu/Low-k Technology with Hybrid (PAE/MSX) Structure", Proceedings of the International Interconnect Conference, p. 222, 2004.
U.S. Appl. No. 11/596,188, filed Nov. 13, 2006, Akiyama, et al.
U.S. Appl. No. 11/489,468, filed Jul. 20, 2006, Akiyama, et al.
U.S. Appl. No. 11/580,959, filed Oct. 16, 2006, Akiyama, et al.
U.S. Appl. No. 12/717,225, filed Mar. 4, 2010, Akiyama, et al.
U.S. Appl. No. 12/749,735, filed Mar. 30, 2010, Nobe, et al.

(Continued)

Primary Examiner — D. S. Nakarani
(74) Attorney, Agent, or Firm — Oblon, Spivak, McClelland, Maier & Neustadt, L.L.P.

(57) ABSTRACT

A method of forming an organic silica film includes forming a coating including a silicon compound having an —Si—O—Si— structure and an —Si—CH$_2$—Si— structure on a substrate, heating the coating, and curing the coating by applying ultraviolet radiation.

20 Claims, No Drawings

U.S. PATENT DOCUMENTS

| | | | |
|---|---|---|---|
| 2007/0027287 A1 | 2/2007 | Akiyama et al. | 528/35 |
| 2007/0088144 A1 | 4/2007 | Kang et al. | 528/28 |
| 2008/0038527 A1 | 2/2008 | Akiyama et al. | 428/219 |
| 2008/0268264 A1 | 10/2008 | Akiyama et al. | 428/447 |
| 2009/0281237 A1 | 11/2009 | Nakagawa et al. | 524/588 |

FOREIGN PATENT DOCUMENTS

| | | |
|---|---|---|
| EP | 1 705 206 A1 | 9/2006 |
| JP | 54 61299 | 5/1979 |
| JP | 63 248710 | 10/1988 |
| JP | 63 289939 | 11/1988 |
| JP | 64 56315 | 3/1989 |
| JP | 1 194980 | 8/1989 |
| JP | 1 248540 | 10/1989 |
| JP | 2 260534 | 10/1990 |
| JP | 3 30427 | 2/1991 |
| JP | 5 105759 | 4/1993 |
| JP | 05-263045 | 10/1993 |
| JP | 05-315319 | 11/1993 |
| JP | 8 29932 | 3/1996 |
| JP | 11-506872 | 6/1999 |
| JP | 11 284189 | 10/1999 |
| JP | 11-340219 | 12/1999 |
| JP | 11-340220 | 12/1999 |
| JP | 2000 109695 | 4/2000 |
| JP | 2000 290590 | 10/2000 |
| JP | 2000 309752 | 11/2000 |
| JP | 2000 313612 | 11/2000 |
| JP | 2001 110802 | 4/2001 |
| JP | 2001 127152 | 5/2001 |
| JP | 2001-286821 | 10/2001 |
| JP | 2001 294809 | 10/2001 |
| JP | 2001 345317 | 12/2001 |
| JP | 2002 69375 | 3/2002 |
| JP | 2002 129103 | 5/2002 |
| JP | 2002 268226 | 9/2002 |
| JP | 2003 115482 | 4/2003 |
| JP | 2003 297819 | 10/2003 |
| JP | 2004/500695 | 1/2004 |
| JP | 2004 356508 | 12/2004 |
| JP | 2005-076031 | 3/2005 |
| KR | 2001-0078164 | 8/2001 |
| TW | 2004 01795 | 2/2004 |
| TW | 2004 04838 | 4/2004 |
| WO | WO 97/00535 | 1/1997 |
| WO | 02 098955 | 12/2002 |
| WO | 03 025994 | 3/2003 |
| WO | 2005/068538 | 7/2005 |
| WO | 2005/108469 | 11/2005 |

OTHER PUBLICATIONS

"Starfire® SP-DEPCS", Starfire® Systems, www.starfiresystems.com, May 2005, p. 1.

"Starfire® SP-DMPCS", Starfire® Systems, www.starfiresystems.com, May 2005, p. 1.

U.S. Appl. No. 12/473,861, filed May 28, 2009, Nobe, et al.

U.S. Appl. No. 12/278,224, filed Aug. 4, 2008, Nakagawa, et al.

U.S. Appl. No. 12/527,327, filed Aug. 14, 2009, Nakagawa, et al.

"Specialty Chemicals" Starfire Systems, Dec. 30, 2005, (1) p. 1.

"Specialty Chemicals" Starfire Systems, Dec. 30, 2005, (2) p. 1.

"Internet Archive Wayback Machine" http://web.archive.org/web/*/http://www.starfiresystems.com, Mar. 16, 2007, p. 1.

Starfire Systems: Projects, Specialty Chemicals, http://web.archive.org/web/20011205120755/www.starfiresystems.com/projects/chemicals.html, Mar. 16, 2007, p. 1-2.

U.S. Appl. No. 12/934,806, filed Sep. 27, 2010, Nakagawa, et al.

Supplementary Search Report issued May 31, 2011 in Europe Application No. 05737244.3.

James L. Hedrick, et al., "Templating Nanoporosity in Thin-Film Dielectric Insulators", Advanced Materials, vol. 10, No. 13, p. 1049-1053, 1998.

European Search Report issued Feb. 20, 2012, in European Application No. 05739243.3.

International Search Report issued Jun. 14, 2005 in PCT/JP05/008222.

International Search Report issued Jun. 14, 2005 in PCT/JP05/008608.

Office Action dated Dec. 16, 2009 mailed in U.S. Appl. No. 11/596,188.

Office Action dated Aug. 5, 2010 mailed in U.S. Appl. No. 11/596,188.

Office Action dated Jul. 29, 2009 mailed in U.S. Appl. No. 11/580,959.

* cited by examiner

US 8,268,403 B2

METHOD FOR FORMING ORGANIC SILICA FILM, ORGANIC SILICA FILM, WIRING STRUCTURE, SEMICONDUCTOR DEVICE, AND COMPOSITION FOR FILM FORMATION

CROSS REFERENCE TO RELATED APPLICATION

This application is a 371 of PCT/JP05/008223, filed on Apr. 28, 2005, and claims priority to the following Japanese Patent Applications: 2004-141200, filed on May 11, 2004; and 2005-050590, filed on Feb. 25, 2005.

TECHNICAL FIELD

The present invention relates to a method of forming an organic silica film, an organic silica film, a wiring structure, a semiconductor device, and a film-forming composition.

BACKGROUND ART

A silica ($SiO_2$) film formed by a vacuum process such as chemical vapor deposition (CVD) has been widely used as an interlayer dielectric for semiconductor devices and the like. In recent years, a coating-type insulating film called a spin-on-glass (SOG) film which contains a tetraalkoxysilane hydrolysate as the main component has also been used in order to form a more uniform interlayer dielectric. Along with an increase in the degree of integration of semiconductor devices, a low-relative-dielectric-constant interlayer dielectric called an organic SOG film has been developed which contains a polyorganosiloxane as the main component.

An organic SOG material (organic silica sol) is cured by causing silanol groups contained in the sol to undergo dehydration condensation by heating at 350 to 500° C. An insulating film which exhibits a dielectric constant, mechanical strength, and chemical resistance suitable for an interlayer dielectric for semiconductor devices can be formed by using the organic silica sol. On the other hand, since the reaction of the organic silica sol is a solid phase reaction, dehydration condensation proceeds to only a small extent due to diffusion control, whereby heating for a long time (e.g. at least about 30 minutes, and usually one hour or more) is required. In order to perform the heat treatment for a long time, a batch heat treatment furnace which can process a plurality of (usually 50 to 150) wafers at a time has been used to process spin-on low-dielectric-constant interlayer dielectrics. A semiconductor device for which a low-dielectric-constant interlayer dielectric is required is mainly a semiconductor device in the logic device field. A wiring manufacturing step for logic devices has been shifting to a single-wafer process in which wafers are processed one by one in a short time. This is because an ASIC or a custom IC, which is the main trend of the logic devices, is manufactured through small-amount multi-product production, and a single-wafer process has become the main trend of the manufacturing processes in order to improve the degrees of freedom of the manufacturing step.

A method has been proposed in which a composition containing a polysiloxane as the main component is cured using electron beams (U.S. Pat. No. 6,204,201 and European Patent No. 1122770). This method is characterized in that application of electron beams with heating causes not only condensation of silanols but also decomposition and activation of organic groups in an organic silica film, whereby another crosslinked structure such as Si—CHx-Si can be introduced. According to the method using electron beams, a film exhibiting low hygroscopicity and excellent mechanical strength can be obtained by applying electron beams usually for five minutes or less to allow a single-wafer process.

On the other hand, since electric charges accumulated due to application of electron beams may damage a transistor structure in an LSI, there are arguments both for and against the method of curing an interlayer dielectric composition using electron beams (E. Mickler et al., Proceedings of the International Interconnect Conference, p. 190, 2004, Miyajima et al., Proceedings of the International Interconnect Conference, p. 222, 2004).

As a method of curing an interlayer dielectric composition containing an organic silica sol as the main component in a short time without using electron beams, a method using ultraviolet radiation (UV) may be considered.

Technology other than the LSI interlayer dielectric technology is considered below. A technology of combining a silica sol and an alkoxysilane with a photoacid generator or a photobase generator which generates an acid or base upon application of ultraviolet radiation to promote condensation of silanols and alkoxides, thereby causing gelation of the silica sol has been known as an optical sol-gel technology, and applied to form optical waveguides and the like (e.g. JP-A-2000-109695). A silica film obtained by curing the composition using the photoacid generator or the photobase generator generally contains a large amount of residual silanols. Therefore, such a silica film exhibits high hygroscopicity and a high dielectric constant. The amount of water due to the residual silanols may be reduced by heating the gel obtained by applying ultraviolet radiation at about 250 to 500° C. for a period equal to or longer than a specific period (usually 30 minutes or more). However, this method is the same as the above method of curing the silica film by heating. The composition containing the photoacid generator or the photobase generator may pose a problem such as a decrease in insulating properties or deterioration of a wiring metal, since the photoacid generator, the photobase generator, or an acidic or basic substance generated therefrom serves as a charge carrier. This may make it difficult to ensure the quality of an insulating film for LSI semiconductor devices for which high insulation reliability is required.

Since a siloxane compound exhibits excellent transparency to ultraviolet radiation, the siloxane compound has been extensively researched as the main skeleton for F2 photoresists for which ultraviolet radiation with a wavelength of 157 nm is used (e.g. JP-A-2002-268226). This technology basically utilizes the principle of a chemically-amplified photoresist using a KrF or ArF light source although the siloxane is used as the backbone. In this technology, a photoacid generator generates an acidic substance upon application of ultraviolet radiation, and a chemical bond cleaved due to the acid produces a functional group such as a carboxylic acid which is readily dissolved in a basic developer. Specifically, this technology does not promote the crosslinking reaction of the silica sol using ultraviolet radiation.

Since the surface of an organic silica film cured by applying heat, electron beams, or the like exhibits high hydrophobicity, ultraviolet radiation may be applied to reduce the surface hydrophobicity (e.g. U.S. Pat. No. 6,383,913, JP-A-63-248710, JP-A-63-289939, JP-B-8-29932, and JP-A-2001-110802). The above technology is characterized in that the top surface of the organic silica film is oxidized using ozone produced by application of ultraviolet radiation in air to change the hydrophobic surface to a highly reactive hydrophilic surface such as a silanol. This modification is mainly performed to improve adhesion to a film formed in the upper layer.

As described above, technology of applying a polysiloxane resin solution or an organic silica sol solution to a substrate and applying ultraviolet radiation after forming a film has been widely studied. On the other hand, only limited technologies have been reported in which ultraviolet radiation is positively utilized to cure the organic silica sol for forming an interlayer dielectric for LSI semiconductor devices. These limited related-art technologies are disclosed in JP-A-3-30427, JP-A-1-194980, WO 03/025994, and US-A-2004/0058090.

JP-A-3-30427 discloses technology in which a solution prepared by dissolving a tetraalkoxysilane (e.g. tetraethoxysilane (TEOS)) in collodion is applied to a semiconductor substrate and irradiated with ultraviolet radiation in a nitrogen atmosphere to obtain a silicon dioxide film at a low temperature. This technology is characterized in that highly volatile TEOS is fixed using the collodion, and decomposition of the collodion and dehydration condensation of TEOS are promoted by applying ultraviolet radiation.

JP-A-1-194980 discloses technology in which an organosiloxane resin is applied to a substrate and irradiated with ultraviolet radiation with a main wavelength of 254 nm with heating at 200° C. or less, the surface of the organosiloxane film is oxidized by ozone produced by application of ultraviolet radiation, and the organosiloxane film is heated at 400° C. or more, particularly about 900° C. to obtain a densified silicon dioxide film.

WO 03/025994 and US-A-2004/0058090 disclose technology in which hydrogen silsesquioxane (HSQ) or methyl silsesquioxane (MSQ) is cured by applying ultraviolet radiation. In this technology, when ultraviolet radiation is applied to HSQ or an HSQ/MSQ cocondensate in the presence of oxygen, active oxygen (e.g. ozone) produced in the system promotes oxidation of Si—H in HSQ to form a silica film containing a large number of $SiO_2$ bonds. These related-art documents state that the above method is also effective for MSQ and it is effective to cure MSQ in the presence of oxygen. Accordingly, it is considered that the main mechanism of the crosslinking reaction in the above technology is formation of an $SiO_2$ bond due to active oxygen. As described above, it is difficult to form $SiO_2$ bonds in a short time using other curing methods. The feature of the above technology is using ultraviolet radiation. A silica film formed according to the above technology exhibits a high modulus of elasticity and high hardness due to an increase in the number of $SiO_2$ bonds. On the other hand, the hygroscopicity and the dielectric constant of the film are increased due to an increase in hydrophilicity. Accordingly, as a low-dielectric-constant interlayer dielectric for LSI semiconductor devices and its formation method, (a) an organic silica sol which does not contain a source of an ionic substance, a charge carrier, or a corrosive compound such as a photoacid generator, a photobase generator, or a photosensitizer and can be cured in a short time, (b) a method of curing an organic silica film which does not damage a transistor structure and is carried out using a single-wafer process, (c) an organic silica film which does not exhibit hygroscopicity and exhibits high hydrophobicity, and (d) an organic silica film exhibiting mechanical strength to such a degree that the organic silica film can withstand formation of a copper damascene structure have been demanded.

In particular, when forming a multilayer wiring structure for semiconductor devices, an insulating film formed is subjected to plasma etching and chemical treatment during processing. An insulating film obtained by the related-art technology exhibits insufficient plasma etching resistance, even if it exhibits a low relative dielectric constant and high mechanical strength.

Plasma damage during processing the insulating film is mainly caused by a phenomenon in which radicals produced by plasma remove $CH_3$ from an Si—$CH_3$ structure of a polysiloxane. A silyl radical secondarily produced when $CH_3$ is removed from the Si—$CH_3$ structure promptly reacts with an oxygen atom or an oxygen radical present near the silyl radical and attracts hydrogen to form a silanol group (Si—OH). The presence of the silanol group increases the hygroscopicity of the insulating film, whereby an increase in relative dielectric constant, deterioration in chemical resistance, and a decrease in electrical insulating properties occur.

As a method of improving plasma resistance, a method may be considered in which the absolute amount of Si—$CH_3$ structure in the insulating film is merely increased so that a large amount of $CH_3$ is removed in the top layer to form a densified layer in the top layer, thereby improving apparent plasma resistance and RIE resistance. However, there is a limit to introduction of the Si—$CH_3$ structure group into the polysiloxane from the viewpoint of maintaining the performance of the insulating film, particularly the hardness and the modulus of elasticity. As a method of improving plasma resistance while maintaining the property balance of a low-dielectric-constant interlayer dielectric, a method of incorporating an Si—$CH_2$—Si unit into a polysiloxane structure can be given. The Si—$CH_2$—Si unit has resistance to abstraction reaction due to radicals in comparison with the Si—$CH_3$ unit. By dispersing the Si—$CH_2$—Si units in the film, reactive radicals serve as a barrier diffused in the film, whereby the plasma resistance of the entire film is improved.

As a material which contains the Si—$CH_2$—Si unit and used to form a low-dielectric-constant interlayer dielectric, a composition containing a polycarbosilane or prepared by mixing a polysiloxane and a polycarbosilane has been proposed (JP-A-2001-127152).

This composition aims at improving heat resistance and hygroscopic resistance. However, since the polycarbosilane and the polysiloxane undergo microphase separation when forming a film, it is difficult to uniformly disperse the Si—$CH_2$—Si units over the entire film. This results in formation of a portion with low plasma resistance, whereby an interlayer dielectric exhibiting low plasma resistance over the entire film is obtained.

DISCLOSURE OF THE INVENTION

An object of the invention is to provide a method of forming an organic silica film capable of efficiently curing a coating in a short time at a low temperature and forming a film which may be suitably used as an interlayer dielectric for semiconductor devices and the like and exhibits a low relative dielectric constant and excellent mechanical strength, adhesion, plasma resistance, and chemical resistance, and a film-forming composition used for the method.

Another object of the invention is to provide an organic silica film obtained by the method of forming an organic silica film according to the invention, a wiring structure including the organic silica film, and a semiconductor device including the wiring structure.

A method of forming an organic silica film according to the invention comprises forming a coating including a silicon compound having an —Si—O—Si—structure and an —Si—$CH_2$—Si—structure on a substrate, heating the coating, and curing the coating by applying ultraviolet radiation.

In the above method of forming an organic silica film according to the invention, the silicon compound may contain the —Si—O—Si—structure and the —Si—CH$_2$—Si— structure at an —Si—CH$_2$—Si—/—Si—O—Si—ratio (molar ratio) of 0.025 to 2.00.

In the above method of forming an organic silica film according to the invention, the silicon compound may have a carbon content of 11 to 26 mol %.

In the above method of forming an organic silica film according to the invention, the ultraviolet radiation may have a wavelength of 250 nm or less.

In the above method of forming an organic silica film according to the invention, the coating may be heated while applying the ultraviolet radiation. In this case, the coating may be heated at 300 to 450° C.

In the above method of forming an organic silica film according to the invention, the ultraviolet radiation may be applied in the absence of oxygen.

In the above method of forming an organic silica film according to the invention, the silicon compound may be a hydrolysis-condensation product obtained by hydrolyzing and condensing (B) a hydrolyzable-group-containing silane monomer in the presence of (A) a polycarbosilane.

An organic silica film according to the invention may be obtained by the above method of forming an organic silica film according to the invention and have a relative dielectric constant of 1.5 to 3.5 and a film density of 0.7 to 1.3 g/cm$^3$.

A wiring structure according to the invention comprises the above organic silica film according to the invention as an interlayer dielectric.

A semiconductor device according to the invention comprises the above wiring structure according to the invention.

A film-forming composition according to the invention comprises a hydrolysis-condensation product obtained by hydrolyzing and condensing (B) a hydrolyzable-group-containing silane monomer in the presence of (A) a polycarbosilane, and an organic solvent, and is used in the above method of forming an organic silica film according to the invention to form the coating.

In the above film-forming composition according to the invention, the hydrolysis-condensation product may contain carbon atoms in an amount of 11 to 26 mol %.

In the above film-forming composition according to the invention, the amount of the component (A) may be 1 to 1000 parts by weight for 100 parts by weight of the component (B) converted into a complete hydrolysis-condensation product.

Since the method of forming an organic silica film according to the invention includes forming the coating including the silicon compound on the substrate, heating the coating, and curing the coating by applying ultraviolet radiation, the coating can be efficiently cured in a shorter time at a lower temperature. This allows provision of an organic silica film which may be suitably used as an interlayer dielectric for semiconductor devices and the like and exhibits a low relative dielectric constant and excellent chemical resistance, plasma resistance, and mechanical strength in the semiconductor manufacturing step.

BEST MODE FOR CARRYING OUT THE INVENTION

The invention is described below in more detail.

1. ORGANIC SILICA FILM AND METHOD OF FORMING THE SAME

A method of forming an organic silica film according to the invention includes forming a coating including a silicon compound having an —Si—O—Si— structure and an —Si—CH$_2$—Si— structure (hereinafter may be simply called "silicon compound") on a substrate, heating the coating, and curing the coating by applying ultraviolet radiation.

1.1. Coating Including Silicon Compound

In the invention, the coating including the silicon compound having an —Si—O—Si— structure and an —Si—CH$_2$—Si—structure is formed on the substrate.

In the invention, the ratio (molar ratio) of the —Si—CH$_2$—Si—structure to the —Si—O—Si—structure in the silicon compound is preferably 0.025 to 2.000. If the molar ratio is less than 0.025 or exceeds 2.000, it is difficult to improve plasma resistance and chemical resistance while maintaining a relative dielectric constant and mechanical strength.

In the invention, the number of moles of the —Si—O—Si—structure refers to the number of moles assuming that hydrolyzable silane monomers used are completely hydrolyzed and condensed in a silicon compound formed of a hydrolysis-condensation product described later. The number of moles of the Si—CH$_2$—Si—structure refers to the number of moles of the —Si—CH$_2$—Si—structure contained in a polycarbosilane described later.

In the invention, the carbon atom concentration in the coating including the silicon compound is preferably 11 to 26 mol %. If the carbon atom concentration in the silicon compound is less than 11 mol %, the resulting film may not exhibit sufficient plasma resistance and chemical resistance. If the carbon atom concentration exceeds 26 mol %, the resulting film may not exhibit well-balanced insulating properties and mechanical strength as an interlayer dielectric.

In the invention, the carbon atom concentration in the coating including the silicon compound refers to the amount of carbon atoms in the silicon compound including a hydrolysis-condensation product when hydrolyzable silane monomers described later are completely hydrolyzed and condensed.

The thickness of the coating including the silicon compound is usually 1 to 2,000 nm, and preferably 10 to 1,000 nm.

In the invention, the coating including the silicon compound may be formed by applying a solution prepared by dissolving a polymer in an organic solvent and drying the applied solution, or may be formed by CVD or the like. It is preferable that the coating including the silicon compound be a film obtained by applying a film-forming composition described below to the substrate and drying the applied composition.

1.2. Film-Forming Composition and Method of Producing the Same

In the invention, a preferred film-forming composition for forming the coating including the silicon compound preferably includes a polycarbosilane and a polysiloxane as polymer components. The film-forming composition according to the invention may be produced by dissolving a polycarbosilane and a polysiloxane in an organic solvent. In particular, it is preferable that the film-forming composition according to the invention be a composition produced by dissolving a hydrolysis-condensation product obtained by hydrolyzing and condensing (B) a hydrolyzable-group-containing silane monomer (hereinafter also called "component (B)") in the presence of (A) a polycarbosilane (hereinafter also called "component (A)") in an organic solvent.

The term "hydrolyzable group" used herein refers to a group which may be hydrolyzed during production of the film-forming composition according to the invention. Specific examples of the hydrolyzable group include a halogen atom, a hydroxyl group, an alkoxy group, an acyloxy group, a sulfone group, a methanesulfone group, and a trifluoromethanesulfone group. Note that the hydrolyzable group is not limited to these groups. Each component of the film-forming composition according to the invention when the film-forming composition includes the hydrolysis-condensation product and the organic solvent is described below.

1.2.1. Hydrolysis-Condensation Product

The polystyrene-reduced weight average molecular weight (Mw) of the hydrolysis-condensation product is preferably 1,500 to 500,000, more preferably 2,000 to 200,000, and still more preferably 2,000 to 100,000. If the polystyrene-reduced weight average molecular weight of the hydrolysis-condensation product is less than 1,500, the target dielectric constant may not be achieved. If the polystyrene-reduced weight average molecular weight exceeds 500,000, the coating may exhibit poor inplane uniformity.

When producing the hydrolysis-condensation product, the component (A) is used in an amount of preferably 1 to 1000 parts by weight, more preferably 5 to 100 parts by weight, and still more preferably 5 to 20 parts by weight for 100 parts by weight of the complete hydrolysis-condensation product of the component (B). If the amount of the component (A) is less than 1 part by weight, the resulting film may not exhibit sufficient chemical resistance. If the amount of the component (A) exceeds 1000 parts by weight, the resulting film may not exhibit a low dielectric constant.

1.2.1-1. Component (A)

In the invention, the polycarbosilane (A) (component (A)) may be a polycarbosilane compound of the following general formula (1) (hereinafter also called "compound 1"), for example.

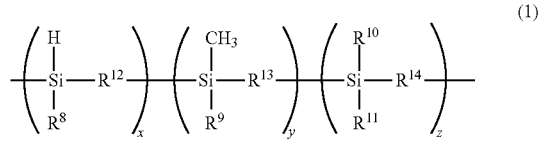

(1)

wherein $R^8$ represents a group selected from a hydrogen atom, a halogen atom, a hydroxyl group, an alkoxy group, an acyloxy group, a sulfone group, a methanesulfone group, a trifluoromethanesulfone group, an alkyl group, an alkenyl group, and an aryl group, $R^9$ represents a group selected from a halogen atom, a hydroxyl group, an alkoxy group, an acyloxy group, a sulfone group, a methanesulfone group, a trifluoromethanesulfone group, an alkyl group, an alkenyl group, and an aryl group, $R^{10}$ and $R^{11}$ individually represent groups selected from a halogen atom, a hydroxyl group, an alkoxy group, an acyloxy group, a sulfone group, a methanesulfone group, a trifluoromethanesulfone group, an alkyl group having 2 to 6 carbon atoms, an alkenyl group, and an aryl group, $R^{12}$ to $R^{14}$ individually represent groups selected from a methylene group, an alkylene group, an alkenylene group, and an arylene group, provided that at least one of $R^{12}$ to $R^{14}$ represents a methylene group, and x, y, and z individually represent integers from 0 to 10,000, provided that $5<x+y+z<10,000$ is satisfied. When x=0, one of $R^9$, $R^{10}$, and $R^{11}$ represents a hydrogen atom, a hydroxyl group, an alkoxy group, an acyloxy group, a sulfone group, a methanesulfone group, or a trifluoromethanesulfone group.

As examples of the alkoxy group in the general formula (1), a methoxy group, an ethoxy group, a propoxy group, a butoxy group, and the like can be given. As examples of the acyloxy group in the general formula (1), an acetoxy group, a benzoyloxy group, and the like can be given. As examples of the alkyl group in the general formula (1), a methyl group, an ethyl group, a propyl group, a butyl group, and the like can be given. As examples of the alkenyl group in the general formula (1), a vinyl group, an allyl group, a 3-butenyl group, a 3-pentenyl group, a 3-hexenyl group, and the like can be given. As examples of the aryl group in the general formula (1), a phenyl group, a naphthyl group, a methylphenyl group, an ethylphenyl group, a chlorophenyl group, a bromophenyl group, a fluorophenyl group, and the like can be given.

As examples of the alkylene group in the general formula (1), a methylene group, a propylene group, a butylene group, a hexylene group, a decylene group, and the like can be given. The alkylene group preferably includes 2 to 6 carbon atoms. The alkylene group may be either linear or branched or may form a ring. A hydrogen atom of the alkylene group may be replaced with a fluorine atom or the like.

As examples of the alkenylene group in the general formula (1), an ethenylene group, a propenylene group, a 1-butenylene group, a 2-butenylene group, and the like can be given. The alkenylene group may be a dienylene group. The alkenylene group preferably includes 1 to 4 carbon atoms. A hydrogen atom of the alkenylene group may be replaced with a fluorine atom or the like. As examples of the arylene group, a phenylene group, a naphthylene group, and the like can be given. A hydrogen atom of the arylene group may be replaced with a fluorine atom or the like. $R^8$ to $R^{11}$; may be either the same or different groups.

In the general formula (1), x, y, and z individually represent integers from 0 to 10,000, provided that $5<x+y+z<10,000$. If $x+y+z<5$, the film-forming composition may exhibit poor storage stability. If $10,000<x+y+z$, the component (B) may be separated from the component (A), whereby a uniform film may not be formed. It is preferable that x, y, and z be respectively $0 \leq x \leq 800$, $0 \leq y \leq 500$, and $0 \leq z \leq 1000$, more preferably $0 \leq x \leq 500$, $0 \leq y \leq 300$, and $0 \leq z \leq 500$, and still more preferably $0 \leq x \leq 100$, $0 \leq y \leq 50$, and $0 \leq z \leq 100$. In the general formula (1), it is preferable that x, y, and z satisfy $5<x+y+z<1000$, more preferably $5<x+y+z<500$, still more preferably $5<x+y+z<250$, and most preferably $5<x+y+z<100$.

In the general formula (1), when x=0, one of $R^9$, $R^{10}$, and $R^{11}$ represents a hydrogen atom, a hydroxyl group, an alkoxy group, an acyloxy group, a sulfone group, a methanesulfone group, or a trifluoromethanesulfone group. This allows the component (A) to include an Si—OH group or a functional group which produces an Si—OH group by hydrolysis and allows the Si—OH group in the component (A) to be condensed with an Si—OH group in the component (B), whereby formation of a composite structure progresses.

The compound 1 may be obtained by reacting at least one compound selected from chloromethyltrichlorosilane, bromomethyltrichlorosilane, chloromethylmethyldichlorosilane, chloromethylethyldichlorosilane, chloromethylvinyldichlorosilane, chloromethylphenyldichlorosilane, bromomethylmethyldichlorosilane, bromomethylvinyldichlorosilane, chloromethyldimethylchlorosilane, chloromethyldivinylchlorosilane, bromomethyldimethylchlorosilane, (1-chloroethyl)trichlorosilane, (1-chloropropyl)trichlorosilane, chloromethyltrimethoxysilane, bromomethyltrimethoxysilane, chloromethylmethyldimethoxysilane, chloromethylvinyldimethoxysilane, chloromethylphenyldimethoxysilane, bromomethylmethyldimethoxysilane, bromomethylvinyldimethoxysilane, bromomethylphenyldimethoxysilane, chloromethyldimethylmethoxysilane, chloromethyldivinylmethoxysilane, chloromethyldiphenylmethoxysilane, bromomethyldimethylmethoxysilane, bromomethyldiisopropylmethoxysilane, chloromethyltriethoxysilane, bromomethyltriethoxysilane, chloromethylmethyldiethoxysilane, chloromethylethyldiethoxysilane, chloromethylvinyldiethoxysilane, chloromethylphenyldiethoxysilane, bromomethylmethyldiethoxysilane, bromomethylvinyldiethoxysilane, bromomethylphenyldiethoxysilane, chloromethyldimethylethoxysilane, chloromethyldiethylethoxysilane, bromomethyldivinylethoxysilane, chloromethyltriisopropoxysilane, and bromomethyltriisopropoxysilane in the presence of at least one of an alkali metal and an alkaline earth metal, followed by an optional treatment with an alcohol, an organic acid, a reducing agent, or the like.

As the alkali metal, Li, Na, and K are preferable. As the alkaline earth metal, Mg and the like are preferable.

The compound 1 may also be obtained by thermal decomposition rearrangement reaction (Yajima rearrangement reaction) of a polydimethylsilane.

1.2.1-2. Hydrolyzable Group-Containing Silane Monomer (B)

In the invention, the hydrolyzable group-containing silane monomer (B) is not particularly limited insofar as the silane monomer contains a hydrolyzable group. For example, the hydrolyzable group-containing silane monomer (B) may be at least one silane compound selected from a compound of the following general formula (2) (hereinafter also called "compound 2") and a compound of the following general formula (3) (hereinafter also called "compound 3").

$$R^1_a SiX_{4-a} \qquad (2)$$

wherein $R^1$ represents a hydrogen atom, a fluorine atom, or a monovalent organic group, X represents a group selected from a halogen atom, a hydroxyl group, an alkoxy group, and an acyloxy group, and a represents an integer from 0 to 3.

$$R^2_b Y_{3-b} Si-(R^4)_d-SiZ_{3-c} R^3_c \qquad (3)$$

wherein $R^2$ and $R^3$ individually represent monovalent organic groups, b and c individually represent integers from 0 to 2, $R^4$ represents an oxygen atom, a phenylene group, or a group $-(CH_2)_e-$ (wherein e represents an integer from 1 to 6), Y and Z individually represent groups selected from a halogen atom, a hydroxyl group, an alkoxy group, and an acyloxy group, and d represents 0 or 1.

As examples of the halogen atom represented by X and Y in the general formulas (2) and (3), a fluorine atom, chlorine atom, bromine atom, and iodine atom can be given. As R of the alkoxy group (—OR) represented by X and Y in the general formulas (2) and (3), an alkyl group and an aryl group given later as examples for $R^1$ to $R^4$ can be given. As R of the acyloxy group (—OCOR) represented by X and Y in the general formulas (2) and (3), an alkyl group and an aryl group given later as examples for $R^1$ to $R^4$ can be given.

1.2.1-2A. Compound 2

In the general formula (2), $R^1$ represents a hydrogen atom, a fluorine atom, or a monovalent organic group. As examples of the monovalent organic group, an alkyl group, an alkenyl group, an aryl group, and the like can be given. In the general formula (2), $R^1$ preferably represents a monovalent organic group, and particularly preferably an alkyl group, an alkenyl group, or a phenyl group.

As examples of the alkyl group, a methyl group, an ethyl group, a propyl group, a butyl group, and the like can be given. The alkyl group preferably includes 1 to 5 carbon atoms. The alkyl group may be either linear or branched. A hydrogen atom of the alkyl group may be replaced with a fluorine atom or the like.

As examples of the alkenyl group, a vinyl group, an allyl group, a 3-butenyl group, a 3-pentenyl group, a 3-hexenyl group, and the like can be given.

As examples of the aryl group, a phenyl group, a naphthyl group, a methylphenyl group, an ethylphenyl group, a chlorophenyl group, a bromophenyl group, a fluorophenyl group, and the like can be given.

The hydrocarbon portion of the alkoxy group represented by X may be the group given as the monovalent organic group represented by $R^2$.

Specific examples of the compound 2 include silicon compounds such as tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, trimethoxysilane, triethoxysilane, tri-n-propoxysilane, tri-iso-propoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotri-iso-propoxysilane, fluorotri-n-butoxysilane, fluorotri-sec-butoxysilane, fluorotri-tert-butoxysilane, fluorotriphenoxysilane, methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, i-propyltrimethoxysilane, i-propyltriethoxysilane, i-propyltri-n-propoxysilane, i-propyltri-iso-propoxysilane, i-propyltri-n-butoxysilane, i-propyltri-sec-butoxysilane, i-propyltri-tert-butoxysilane, i-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyl-tri-iso-propoxysilane, sec-butyl-tri-n-butoxysilane, sec-butyl-tri-sec-butoxysilane, sec-butyl-tri-tert-butoxysilane, sec-butyl-triphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-sec-butoxysilane, phenyltri-tert-butoxysilane, phenyltriphenoxysilane, dimethyldimethoxysilane, dimethyldiethoxysilane, dimethyl-di-n-propoxysilane, dimethyl-di-iso-propoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyl-di-iso-propoxysilane, diethyl-di-n-butoxysilane, diethyl-di-sec-butoxysilane, diethyl-di-tert-butoxysilane, diethyl-di-phenoxysilane, di-n-propyldimethoxysilane, di-n-propyldiethoxysilane, di-n-propyl-di-n-propoxysilane, di-n-propyl-di-iso-propoxysilane, di-n-propyl-di-n-butoxysilane, di-n-propyl-di-sec-butoxysilane, di-n-propyl-di-tert-butoxysilane, di-n-propyl-di-phenoxysilane, di-iso-propyldimethoxysilane, di-iso-propyldiethoxysilane, di-iso-propyl-di-n-propoxysilane, di-iso-propyl-di-iso-propoxysilane, di-iso-propyl-di-n-butoxysilane, di-iso-propyl-di-sec-butoxysilane, di-iso-propyl-di-tert-butoxysilane, di-iso-propyl-di-phenoxysilane, di-n-butyldimethoxysilane, di-n-butyldiethoxysilane, di-n-butyl-di-n-propoxysilane, di-n-butyl-di-iso-propoxysilane, di-n-butyl-di-n-butoxysilane, di-n-butyl-di-sec-butoxysilane, di-n-butyl-di-tert-butoxysilane, di-n-butyl-di-phenoxysilane, di-sec-butyldimethoxysilane, di-sec-butyldiethoxysilane, di-sec-butyl-di-n-propoxysilane, di-sec-butyl-di-iso-propoxysilane, di-sec-butyl-di-n-butoxysilane, di-sec-butyl-di-sec-butoxysilane, di-sec-butyl-di-tert-butoxysilane, di-sec-butyl-di-phenoxysilane, di-tert-butyldimethoxysilane, di-tert-butyldiethoxysilane, di-tert-butyl-di-n-propoxysilane, di-tert-butyl-di-iso-propoxysilane, di-tert-butyl-di-n-butoxysilane, di-tert-butyl-di-sec-butoxysilane, di-tert-butyl-di-tert-butoxysilane, di-tert-butyl-di-phenoxysilane, diphenyldimethoxysilane, diphenyl-di-ethoxysilane, diphenyl-di-n-propoxysilane, diphenyl-di-iso-propoxysilane, diphenyl-di-n-butoxysilane, diphenyl-di-sec-butoxysilane, diphenyl-di-tert-butoxysilane, diphenyldiphenoxysilane, divinyltrimethoxysilane, tetrachlorosilane, tetrabromosilane, tetraiodosilane, trichlorosilane, tribromosilane, triiodosilane, methyltrichlorosilane, ethyltrichlorosilane, n-propyltrichlorosilane, isopropyltrichlorosilane, n-butyltrichlorosilane, t-butyltrichlorosilane, cyclohexyltrichlorosilane, phenethyltrichlorosilane, 2-norbornyltrichlorosilane, vinyltrichlorosilane, phenyltrichlorosilane, methyltribromosilane, ethyltribromosilane, n-propyltribromosilane, isopropyltribromosilane, n-butyltribromosilane, t-butyltribromosilane, cyclohexyltribromosilane, phenethyltribromosilane, 2-norbornyltribromosilane, vinyltribromosilane, phenyltribromosilane, methyltriiodosilane, ethyltriiodosilane, n-propyltriiodosilane, isopropyltriiodosilane, n-butyltriiodosilane, t-butyltriiodosilane, cyclohexyltriiodosilane, phenethyltriiodosilane, 2-norbornyltriiodosilane, vinyltriiodosilane, phenyltriiodosilane, dimethyldichlorosilane, diethyldichlorosilane, di-n-propyldichlorosilane, diisopropyldichlorosilane, di-n-butyldichlorosilane, di-t-butyldichlorosilane, dicyclohexyldichlorosilane, diphenethyldichlorosilane, di-2-norbornyldichlorosilane, divinyldichlorosilane, diphenyldichlorosilane, dimethyldibromosilane, diethyldibromosilane, di-n-propyldibromosilane, diisopropyldibromosilane, di-n-butyldibromosilane, di-t-butyldibromosilane, dicyclohexyldibromosilane, diphenethyldibromosilane, di-2-norbornyldibromosilane, divinyldibromosilane, diphenyldibromosilane, dimethyldiiodosilane, diethyldiiodosilane, di-n-propyldiiodosilane, diisopropyldiiodosilane, di-n-butyldiiodosilane, di-t-butyldiiodosilane, dicyclohexyldiiodosilane, diphenethyldiiodosilane, di-2-norbornyldiiodosilane, divinyldiiodosilane, diphenyldiiodosilane, trimethylchlorosilane, triethylchlorosilane, tri-n-propylchlorosilane, triisopropylchlorosilane, tri-n-butylchlorosilane, tri-t-butylchlorosilane, tricyclohexylchlorosilane, triphenethylchlorosilane, tri-2-norbornylchlorosilane, trivinylchlorosilane, triphenylchlorosilane, trimethylbromosilane, triethylbromosilane, tri-n-propylbromosilane, triisopropylbromosilane, tri-n-butylbromosilane, tri-t-butylbromosilane, tricyclohexylbromosilane, triphenethylbromosilane, tri-2-norbornylbromosilane, trivinylbromosilane, triphenylbromosilane, trimethyliodosilane, triethyliodosilane, tri-n-propyliodosilane, triisopropyliodosilane, tri-n-butyliodosilane, tri-t-butyliodosilane, tricyclohexyliodosilane, triphenethyliodosilane, tri-2-norbornyliodosilane, trivinyliodosilane, and triphenyliodosilane. These compounds may be used either individually or in combination of two or more.

The compound 2 is preferably methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, or the like.

These compounds may be used either individually or in combination of two or more.

1.2.1-2B. Compound 3

As examples of the monovalent organic groups represented by $R^2$ and $R^3$ in the general formula (3), the organic groups given as examples for the general formula (2) can be given.

As examples of the compound 3 in which $R^4$ in the general formula (3) is an oxygen atom, hexachlorodisiloxane, hexabromodisiloxane, hexaiodedisiloxane, hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentaphenoxy-3-methyldisiloxane, 1,1,1,3,3-pentamethoxy-3-ethyldisiloxane, 1,1,1,3,3-pentaethoxy-3-ethyldisiloxane, 1,1,1,3,3-pentaphenoxy-3-ethyldisiloxane, 1,1,1,3,3-pentamethoxy-3-phenyldisiloxane, 1,1,1,3,3-pentaethoxy-3-phenyldisiloxane, 1,1,1,3,3-pentaphenoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetraphenoxy-1,3-dimethyldisiloxane, 1,1,3,3-tetramethoxy-1,3-diethyldisiloxane, 1,1,3,3-tetraethoxy-1,3-diethyldisiloxane, 1,1,3,3-tetraphenoxy-1,3-diethyldisiloxane, 1,1,3,3-tetramethoxy-1,3-diphenyldisiloxane, 1,1,3,3-tetraethoxy-1,3-diphenyldisiloxane, 1,1,3,3-tetraphenoxy-1,3-diphenyldisiloxane, 1,1,3-trimethoxy-1,3,3-trimethyldisiloxane, 1,1,3-triethoxy-1,3,3-trimethyldisiloxane, 1,1,3-triphenoxy-1,3,3-trimethyldisiloxane, 1,1,3-trimethoxy-1,3,3-triethyldisiloxane, 1,1,3-triethoxy-1,3,3-triethyldisiloxane, 1,1,3-triphenoxy-1,3,3-triethyldisiloxane, 1,1,3-trimethoxy-1,3,3-triphenyldisiloxane, 1,1,3-triethoxy-1,3,3-triphenyldisiloxane, 1,1,3-triphenoxy-1,3,3-triphenyldisiloxane, 1,3-dimethoxy-1,1,3,3-tetramethyldisiloxane, 1,3-diethoxy-1,1,3,3-tetramethyldisiloxane, 1,3-diphenoxy-1,1,3,3-tetramethyldisiloxane, 1,3-dimethoxy-1,1,3,3-tetraethyldisiloxane, 1,3-diethoxy-1,1,3,3-tetraethyldisiloxane, 1,3-diphenoxy-1,1,3,3-tetraethyldisiloxane, 1,3-dimethoxy-1,1,3,3-tetraphenyldisiloxane, 1,3-diethoxy-1,1,3,3-tetraphenyldisiloxane, 1,3-diphenoxy-1,1,3,3-tetraphenyldisiloxane, and the like can be given.

Of these, hexamethoxydisiloxane, hexaethoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane, 1,3-diethoxy-1,1,3,3-tetraphenyldisiloxane, and the like are preferable.

As examples of the compound in which d is zero in the general formula (3), hexachlorodisilane, hexabromodisilane, hexaiodedisilane, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compound in which $R^4$ in the general formula (3) is the group —$(CH_2)_e$—, bis(trichlorosilyl)methane, bis(tribromosilyl)methane, bis(triiodosilyl)methane, bis(trichlorosilyl)ethane, bis(tribromosilyl)ethane, bis(triiodosilyl)ethane, bis(trimethoxysilyl)methane, bis(triethoxysilyl)methane, bis(tri-n-propoxysilyl)methane, bis(tri-i-propoxysilyl)methane, bis(tri-n-butoxysilyl)methane, bis(tri-sec-butoxysilyl)methane, bis(tri-t-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-i-propoxysilyl)ethane, 1,2-bis(tri-n-butoxysilyl)ethane, 1,2-bis(tri-sec-butoxysilyl)ethane, 1,1,2,2-bis(tri-t-butoxysilyl)ethane, 1-(dimethoxymethylsilyl)-1-(trimethoxysilyl)methane, 1-(diethoxymethylsilyl)-1-(triethoxysilyl)methane, 1-(di-n-propoxymethylsilyl)-1-(tri-n-propoxysilyl)methane, 1-(di-i-propoxymethylsilyl)-1-(tri-1-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-t-butoxymethylsilyl)-1-(tri-t-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-1-propoxymethylsilyl)-2-(tri-1-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-t-butoxymethylsilyl)-2-(tri-t-butoxysilyl)ethane, bis(dimethoxymethylsilyl)methane, bis(diethoxymethylsilyl)methane, bis(di-n-propoxymethylsilyl)methane, bis(di-1-propoxymethylsilyl)methane, bis(di-n-butoxymethylsilyl)methane, bis(di-sec-butoxymethylsilyl)methane, bis(di-t-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-1-propoxymethylsilyl)ethane, 1,2-bis(di-n-butoxymethylsilyl)ethane, 1,2-bis(di-sec-butoxymethylsilyl)ethane, 1,2-bis(di-t-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-1-propoxysilyl)benzene, 1,2-bis(tri-n-butoxysilyl)benzene, 1,2-bis(tri-sec-butoxysilyl)benzene, 1,2-bis(tri-t-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-i-propoxysilyl)benzene, 1,3-bis(tri-n-butoxysilyl)benzene, 1,3-bis(tri-sec-butoxysilyl)benzene, 1,3-bis(tri-t-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-i-propoxysilyl)benzene, 1,4-bis(tri-n-butoxysilyl)benzene, 1,4-bis(tri-sec-butoxysilyl)benzene, 1,4-bis(tri-t-butoxysilyl)benzene, and the like can be given.

Of these, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(tri ethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable.

The compounds 2 and 3 may be used individually or in combination of two or more.

When hydrolyzing and condensing at least one silane compound selected from the group consisting of the compounds 2 and 3 in the compound (A), it is preferable to use water in an amount of more than 0.5 mol and 150 mol or less, and particularly preferably more than 0.5 mol and 130 mol or less for 1 mol of the compounds 2 and 3.

1.2.1-3. Method of Producing Hydrolysis-Condensation Product

The hydrolysis-condensation product according to the invention is obtained by hydrolyzing and condensing the component (B) in the presence of the component (A).

The component (B) may be hydrolyzed in a state in which the component (A) and the component (B) are dissolved in an organic solvent. As examples of the organic solvent which may be used, methanol, ethanol, propanol, butanol, tetrahydrofuran, gamma-butyrolactone, propylene glycol monoalkyl ether, and ethylene glycol monoalkyl ether can be given.

The hydrolysis-condensation temperature is 0 to 100° C., and preferably 20 to 60° C., and the reaction time is 30 minutes to 24 hours, and preferably 1 to 8 hours.

A specific catalyst may be used when producing the hydrolysis-condensation product by hydrolyzing and condensing the component (B) in the presence of the component (A). As the catalyst, at least one catalyst selected from the group consisting of an alkali catalyst, a metal chelate catalyst, and an acid catalyst may be used.

As examples of the alkali catalyst, sodium hydroxide, potassium hydroxide, lithium hydroxide, pyridine, pyrrole, piperazine, pyrrolidine, piperidine, picoline, monoethanolamine, diethanolamine, dimethyl monoethanolamine, monomethyldiethanolamine, triethanolamine, diazabicyclooctane, diazabicyclononane, diazabicycloundecene, tetramethylammonium hydroxide, tetraethylammonium hydroxide, tetrapropylammonium hydroxide, tetrabutylammonium hydroxide, ammonia, methylamine, ethylamine, propylamine, butylamine, pentylamine, hexylamine, pentylamine, octylamine, nonylamine, decylamine, N,N-dimethylamine, N,N-diethylamine, N,N-dipropylamine, N,N-dibutylamine, trimethylamine, triethylamine, tripropylamine, tributylamine, cyclohexylamine, trimethylimidine, 1-amino-3-methylbutane, dimethylglycine, 3-amino-3-methylamine, and the like can be given. The alkali catalyst is preferably an amine or an amine salt, particularly preferably an organic amine or an organic amine salt, most preferably an alkylamine or tetraalkylammonium hydroxide. These alkali catalysts may be used either individually or in combination of two or more.

Examples of the metal chelate catalyst include titanium chelate compounds such as triethoxy-mono(acetylacetonato)titanium, tri-n-propoxy mono(acetylacetonato)titanium, tri-i-propoxy-mono(acetylacetonato)titanium, tri-n-butoxy mono(acetylacetonato)titanium, tri-sec-butoxy-mono(acetylacetonato)titanium, tri-t-butoxy mono(acetylacetonato)titanium, diethoxy-bis(acetylacetonato)titanium, di-n-propoxy-bis(acetylacetonato)titanium, di-i-propoxy-bis(acetylacetonato)titanium, di-n-butoxy-bis(acetylacetonato)titanium, di-sec-butoxy-bis(acetylacetonato)titanium, di-t-butoxy-bis(acetylacetonato)titanium, monoethoxy-tris(acetylacetonato)titanium, mono-n-propoxy tris(acetylacetonato)titanium, mono-i-propoxy tris(acetylacetonato)titanium, mono-n-butoxy-tris(acetylacetonato)titanium, mono-sec-butoxy-tris(acetylacetonato)titanium, mono-t-butoxy-tris(acetylacetonato)titanium, tetrakis(acetylacetonato)titanium, triethoxy mono(ethyl acetoacetate)titanium, tri-n-propoxy mono(ethyl acetoacetate)titanium, tri-i-propoxy mono(ethyl acetoacetate)titanium, tri-n-butoxy mono(ethyl acetoacetate)titanium, tri-sec-butoxy mono(ethyl acetoacetate)titanium, tri-t-butoxy mono(ethyl acetoacetate)titanium, diethoxy-bis(ethyl acetoacetate)titanium, di-n-propoxy-bis(ethyl acetoacetate)titanium, di-i-propoxy-bis(ethyl acetoacetate)titanium, di-n-butoxy-bis(ethyl acetoacetate)titanium, di-sec-butoxy-bis(ethyl acetoacetate)titanium, di-t-butoxy-bis(ethyl acetoacetate)titanium, monoethoxy-tris(ethyl acetoacetate)titanium, mono-n-propoxy-tris(ethyl acetoacetate)titanium, mono-i-propoxy-tris(ethyl acetoacetate)titanium, mono-n-butoxy-tris(ethyl acetoacetate)titanium, mono-sec-butoxy-tris(ethyl acetoacetate)titanium, mono-t-butoxy-tris(ethyl acetoacetate)titanium, tetrakis(ethyl acetoacetate)titanium, mono(acetylacetonato)tris(ethyl acetoacetate)titanium, bis(acetylacetonato)bis(ethyl acetoacetate)titanium, and tris(acetylacetonato)mono(ethyl acetoacetate)titanium; zirconium chelate compounds such as triethoxy-mono(acetylacetonato)zirconium, tri-n-propoxy mono(acetylacetonato)zirconium, tri-i-propoxy mono(acetylacetonato)zirconium, tri-n-butoxy mono(acetylacetonato)zirconium, tri-sec-butoxy-mono(acetylacetonato)zirconium, tri-t-butoxy-mono(acetylacetonato)zirconium, diethoxy-bis(acetylacetonato)zirconium, di-n-propoxy-bis(acetylacetonato)zirconium, di-i-propoxy-bis(acetylacetonato)zirconium, di-n-butoxy-bis(acetylacetonato)zirconium, di-sec-butoxy-bis(acetylacetonato)zirconium, di-t-butoxy-bis(acetylacetonato)zirconium, monoethoxy-tris(acetylacetonato)zirconium, mono-n-propoxy-tris(acetylacetonato)zirconium, mono-i-propoxy-tris(acetylacetonato)zirconium, mono-n-butoxy-tris(acetylacetonato)zirconium, mono-sec-butoxy-tris(acetylacetonato)zirconium, mono-t-butoxy-tris(acetylacetonato)zirconium, tetrakis(acetylacetonato)zirconium, triethoxy mono(ethyl acetoacetate)zirconium, tri-n-propoxy-mono(ethyl acetoacetate)zirconium, tri-i-propoxy mono(ethyl acetoacetate)zirconium, tri-n-butoxy-mono(ethyl acetoacetate)zirconium, tri-sec-butoxy-mono(ethyl acetoacetate)zirconium, tri-t-butoxy mono(ethyl acetoacetate)zirconium, diethoxy-bis(ethyl acetoacetate)zirconium, di-n-propoxy-bis(ethyl acetoacetate)zirconium, di-i-propoxy-bis(ethyl acetoacetate)zirconium, di-n-butoxy-bis(ethyl acetoacetate)zirconium, di-sec-butoxy-bis(ethyl acetoacetate)zirconium, di-t-butoxy-bis(ethyl acetoacetate)zirconium, monoethoxy tris(ethyl acetoacetate)zirconium, mono-n-propoxy-tris(ethyl acetoacetate)zirconium, mono-i-propoxy-tris(ethyl acetoacetate)zirconium, mono-n-butoxy-tris(ethyl acetoacetate)zirconium, mono-sec-butoxy-tris(ethyl acetoacetate)zirconium, mono-t-butoxy-tris(ethyl acetoacetate)zirconium, tetrakis(ethyl acetoacetate)zirconium, mono(acetylacetonato)tris(ethyl acetoacetate)zirconium, bis(acetylacetonato)bis(ethyl acetoacetate)zirconium, and tris(acetylacetonato)mono(ethyl acetoacetate)zirconium; aluminum chelate compounds such as tris(acetylacetonato)aluminum, tris(ethyl acetoacetate)aluminum; and the like. Of these, titanium or aluminum chelate compounds are preferable, with titanium chelate compounds being particularly preferable. These metal chelate catalysts may be used either individually or in combination of two or more.

As examples of the acid catalyst, inorganic acids such as hydrochloric acid, nitric acid, sulfuric acid, hydrofluoric acid, phosphoric acid, and boric acid; and organic acids such as acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid, hydrolysate of glutaric acid, hydrolysate of maleic anhydride, and hydrolysate of phthalic anhydride can be given. Of these, organic carboxylic acids are preferable. These acid catalysts may be used either individually or in combination of two or more.

The catalyst is used in an amount of usually 0.00001 to 10 mol, and preferably 0.00005 to 5 mol for 1 mol of the total amount of the groups represented by X, Y, and Z in the compounds 2 and 3. If the amount of the catalyst is in the above range, precipitation or gelation of the polymer occurs to only a small extent during the reaction. In the invention, the temperature when hydrolyzing the compounds 2 and 3 is usually 0 to 100° C., and preferably 15 to 80° C.

In the invention, the term "complete hydrolysis-condensation product" refers to a product in which the hydrolyzable groups in the polycarbosilane (A) and the compounds 2 and 3 are completely hydrolyzed into SiOH groups and are completely condensed to form a siloxane structure.

The hydrolysis-condensation product is preferably a hydrolysis-condensation product of the polycarbosilane (A) and the compound 2, since the resulting composition exhibits excellent storage stability. In the invention, the compounds 2 and 3 are used so that the total amount of the compounds 2 and 3 is 500 to 4000 parts by weight, and preferably 1000 to 3000 parts by weight for 100 parts by weight of the polycarbosilane (A).

1.2.2. Organic Solvent

In the film-forming composition according to the invention, the hydrolysis-condensation product may be dissolved or dispersed in an organic solvent together with other components described later, as required.

The organic solvent used as the component of the film-forming composition according to the invention is not particularly limited insofar as the organic solvent can be removed before obtaining the target film. As specific examples of the organic solvent, a protic solvent and a nonprotic solvent can be given. As an example of the protic solvent, an alcohol solvent can be given. As examples of the nonprotic solvent, a ketone solvent, an ester solvent, an ether solvent, an amide solvent, and other nonprotic solvents described later can be given.

Examples of the alcohol solvent include monohydric alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, and diacetone alcohol; polyhydric alcohol solvents such as ethylene glycol, 1,2-polyethylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like. These alcohol solvents may be used either individually or in combination of two or more.

Examples of the ketone solvent include acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonane, cyclohexanone, 2-hexanone, methylcyclohexanone, 2,4-pentanedione, acetonylacetone, acetophenone, and fenchone; beta-diketones such as acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione; and the like. These ketone solvents may be used either individually or in combination of two or more.

Examples of the amide solvent include formamide, N-methylformamide, N,N-dimethylformamide, N-ethylformamide, N,N-diethylformamide, acetamide, N-methylacetamide, N,N-dimethylacetamide, N-ethylacetamide, N,N-diethylacetamide, N-methylpropioneamide, N-methylpyrrolidone, N-formylmorpholine, N-formylpiperidine, N-formylpyrrolidine, N-acetylmorpholine, N-acetylpiperidine, N-acetylpyrrolidine, and the like. These amide solvents may be used either individually or in combination of two or more.

Examples of the ester solvent include diethyl carbonate, ethylene carbonate, propylene carbonate, diethyl carbonate, methyl acetate, ethyl acetate, gamma-butyrolactone, gamma-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like. These ester solvents may be used either individually or in combination of two or more.

Examples of the nonprotic solvent include acetonitrile, dimethylsulfoxide, N,N,N',N'-tetraethylsulfonamide, hexamethylphosphoric acid triamide, N-methylmorphorone, N-methylpyrrole, N-ethylpyrrole, N-methyl-delta$_3$-pyrroline, N-methylpiperidine, N-ethylpiperidine, N,N-dimethylpiperazine, N-methylimidazole, N-methyl-4-piperidone, N-methyl-2-piperidone, N-methyl-2-pyrrolidone, 1,3-dimethyl-2-imidazolidinone, 1,3-dimethyltetrahydro-2(1H)-pyrimidinone, and the like. These nonprotic solvents may be used either individually or in combination of two or more.

As the nonprotic solvent, the ketone solvents such as 2-heptanone, methyl isobutyl ketone, diethyl ketone, and cyclohexanone are preferable. As the alcohol solvent, propylene glycol monopropyl ether and the like are preferable.

The total solid content of the film-forming composition according to the invention thus obtained may be appropriately adjusted according to the application. The total solid content is preferably 2 to 30 wt %. If the total solid content of the film-forming composition is 2 to 30 wt %, the resulting coating has an appropriate thickness, and the composition exhibits excellent storage stability. The total solid content may be adjusted by concentration or dilution with the above organic solvent, as required.

1.2.3. Other Components

The film-forming composition of the invention may not include a reaction accelerator for promoting the hydrolysis and/or condensation of the component (A) and/or the component (B). The term "reaction accelerator" means one of, or a combination of two or more of, a reaction initiator, a catalyst (acid generator or base generator), and a photosensitizer having a ultraviolet absorption function.

A silica film obtained by curing the composition using an acid generator or a base generator generally contains a large amount of residual silanols to exhibit high hygroscopicity. As a result, a film with a high dielectric constant is obtained. A composition containing an acid generator or a base generator may not ensure the quality of an insulating film for LSI semiconductor devices for which high insulation reliability is required, since the acid generator, the base generator, or an acidic or basic material generated therefrom serves as a charge carrier to impair the insulating properties of the film or cause deterioration of a wiring metal.

On the other hand, the film-forming composition according to the invention can prevent such a problem since the coating can be cured by heating and application of ultraviolet radiation, even if the film-forming composition does not contain such a reaction accelerator.

A component such as a surfactant or a silane coupling agent may be further added to the film-forming composition according to the invention. These additives may be added to the solvent in which each component is dissolved or dispersed before producing the film-forming composition.

1.2.3-1. Surfactant

As examples of the surfactant, a nonionic surfactant, an anionic surfactant, a cationic surfactant, an amphoteric surfactant, and the like can be given. Specific examples include a fluorine-containing surfactant, a silicone surfactant, a polyalkylene oxide surfactant, a poly(meth)acrylate surfactant, and the like.

As examples of the fluorine-containing surfactant, compounds in which at least the terminal, the main chain, or the side chain includes a fluoroalkyl or fluoroalkylene group, such as 1,1,2,2-tetrafluorooctyl(1,1,2,2-tetrafluoropropyl) ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1, 1,2,2,3,3-hexafluoropentyl) ether, sodium perfluorododecylsulfonate, 1,1,2,2,8,8,9,9,10,10-decafluorododecane, 1,1,2, 2,3,3-hexafluorodecane, N-3-(perfluorooctanesulfonamide)-propyl-N,N'-dimethyl-N-carboxymethylene ammonium betaine, perfluoroalkyl sulfonamide propyltrimethyl ammonium salt, perfluoroalkyl-N-ethylsulfonylglycine salt, bis(N-perfluorooctylsulfonyl-N-ethylaminoethyl) phosphate, and monoperfluoroalkylethyl phosphate can be given.

As examples of commercially available products of the fluorine-containing surfactant, Megafac F142D, F172, F173, F183 (manufactured by Dainippon Ink and Chemicals, Inc.), Eftop EF301, EF303, EF352 (manufactured by Shin-Akita Kasei Co., Ltd.). Fluorad FC-430, FC-431 (manufactured by Sumitomo 3M, Ltd.), Asahi Guard AG710, Surflon S-382, SC-101, SC-102, SC-103, SC-104, SC-105, SC-106 (manufactured by Asahi Glass Co., Ltd.), BM-1000, BM-1100 (manufactured by BM Chemie), NBX-15 (manufactured by NEOS Co., Ltd.), and the like can be given. Of these, Megafac F172, BM-1000, BM-1100, and NBX-15 are preferable.

As the silicone surfactant, SH7PA, SH21PA, SH28PA, SH30PA, ST94PA (manufactured by Toray-Dow Corning Silicone Co., Ltd.) and the like may be used. Of these, SH28PA and SH30PA are preferable.

The surfactant is used in an amount of usually 0.00001 to 1 part by weight for 100 parts by weight of the film-forming composition. These surfactants may be used either individually or in combination of two or more.

1.2.3-2. Silane Coupling Agent

As examples of the silane coupling agent, 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-triethoxysilylpropyltriethylenetriamine, N-triethoxysilylpropyltriethylenetriamine, 10-trimethoxysilyl-1,4,7-triazadecane, 10-triethoxysilyl-1,4,7-triazadecane, 9-trimethoxysilyl-3,6-diazanonylacetate, 9-triethoxysilyl-3, 6-diazanonylacetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, and the like can be given. These silane coupling agents may be used either individually or in combination of two or more.

1.3. Formation of Organic Silica Film

The method of forming an organic silica film according to the invention includes forming the coating including the silicon compound on the substrate, heating the coating, and curing the coating by applying ultraviolet radiation, as described above.

In the method of forming an organic silica film according to the invention, the coating may be heated while applying ultraviolet radiation. In the curing treatment according to the invention, the organic silica sol can be sufficiently condensed at a relatively low temperature in a short time by heating the coating while applying ultraviolet radiation, whereby the objective organic silica film according to the invention can be obtained. When heating the coating while applying ultraviolet radiation, the curing treatment may be performed for preferably 30 seconds to 10 minutes, and still more preferably 30 seconds to 7 minutes. Each step of the method of forming an organic silica film according to the invention is described below.

1.3.1. Formation of Coating

In the method of forming an organic silica film according to the invention, a coating method such as spin coating, dip coating, roll coating, or spraying is used when forming the coating including the silicon compound. The application target substrate is not particularly limited. As examples of the substrate, Si-containing layers such as Si, $SiO_2$, SiN, SiC, SiCN, and SiON can be given. As a specific example of the substrate, a semiconductor substrate formed of the above material can be given.

1.3.2. Heating of Coating

The resulting coating is then dried at an ordinary temperature or dried by heating at about 80 to 600° C. for 5 to 240 minutes to form a glass-like or high-molecular-weight polymer coating.

As the heating method, a hot plate, an oven, a furnace, or the like may be used. The coating may be heated in air, nitrogen, or argon, under vacuum, or under reduced pressure in which the oxygen concentration is controlled.

1.3.3. Application of Ultraviolet Radiation to Coating

When applying ultraviolet radiation, ultraviolet radiation with a wavelength of preferably 250 nm or less, and still more preferably 150 to 250 nm may be used. Use of ultraviolet radiation with a wavelength within this range allows the molecules in the organic silica sol to be condensed at a low temperature in a short time without using a reaction accelerator sensitive to ultraviolet radiation. If the wavelength of ultraviolet radiation is longer than 250 nm, a sufficient effect of promoting condensation of the organic silica sol is not obtained. If the wavelength of ultraviolet radiation is shorter than 150 nm, decomposition of the organic group or elimination of the organic group bonded to the silicon atom tends to occur in the organic silica sol.

It is preferable to use a light source including a plurality of wavelengths of 250 nm or less when applying ultraviolet radiation in order to prevent a local change in film properties due to standing waves caused by reflection from the substrate to which the film-forming composition is applied.

The heating temperature of the substrate when applying ultraviolet radiation is usually 300 to 450° C. If the heating temperature is lower than 300° C., the mobility of the molecular chain in the organic silica sol is not increased, whereby a sufficiently high condensation rate is not obtained. If the heating temperature is higher than 450° C., the molecules in the organic silica sol tend to decompose. Moreover, a heating temperature of higher than 450° C. hinders a step of a semiconductor device manufacturing process such as a copper damascene process which is usually carried out at 450° C. or less. As the heating means used when applying ultraviolet radiation, a hot plate, infrared lamp annealing, or the like may be used. The time required to cure the coating by heating the coating while applying ultraviolet radiation is generally 30 seconds to 10 minutes (preferably 30 seconds to 7 minutes), which is significantly shorter than the time required to thermally cure the coating (15 minutes to 2 hours). Therefore, application of ultraviolet radiation is suitable for a single-wafer process.

The coating according to the invention may be thermally cured before applying ultraviolet radiation in a state in which the substrate is heated at 250° C. or more and 500° C. or less to form an organic silica film with a relative dielectric constant of 3.0 or less (preferably 2.7 or less), and ultraviolet radiation may be applied to the resulting organic silica film. A variation in thickness due to a nonuniform dose of ultraviolet radiation can be reduced by applying ultraviolet radiation after thermally curing the coating.

In the method of forming an organic silica film according to the invention, the coating may be heated stepwise or an atmosphere such as nitrogen, air, or oxygen, or reduced pressure may be selected in order to control the curing rate of the coating.

The coating according to the invention may be cured in an inert atmosphere or under reduced pressure. In the curing treatment, it is preferable to apply ultraviolet radiation in the absence of oxygen. The term "absence of oxygen" used herein refers to a partial pressure of oxygen of preferably 0.1 kPa or less, and still more preferably 0.01 kPa or less. If the partial pressure of oxygen is higher than 0.1 kPa, ozone is produced during application of ultraviolet radiation. The silicon compound is oxidized by the produced ozone to increase the hydrophilicity of the resulting organic silica film, whereby the hygroscopicity and the relative dielectric constant of the film tend to be increased. Therefore, an organic silica film which exhibits high hydrophobicity and is increased in relative dielectric constant to only a small extent can be obtained by performing the curing treatment in the absence of oxygen.

In the invention, ultraviolet radiation may be applied in an inert gas atmosphere. As examples of the inert gas, $N_2$, He, Ar, Kr, and Xe (preferably He and Ar) can be given. The film is rarely oxidized by applying ultraviolet radiation in an inert gas atmosphere, whereby the low dielectric constant of the resulting coating can be maintained.

In the invention, ultraviolet radiation may be applied in a pressurized atmosphere or under reduced pressure. The pressure is preferably 0.001 to 1000 kPa, and still more preferably 0.001 to 101.3 kPa. If the pressure is outside the above range, the degree of curing may become nonuniform in the plane. In order to control the curing rate of the coating, the coating may be heated stepwise, or the atmospheric conditions such as an inert gas (e.g. nitrogen) or a reduced pressure state may be selected, as required.

Since the method of forming an organic silica film according to the invention includes heating the coating including the silicon compound and curing the coating by applying ultraviolet radiation, the coating can be cured in a shorter time at a lower temperature.

1.4. Organic Silica Film

The organic silica film according to the invention is obtained by the above method of forming an organic silica film according to the invention. In the organic silica film according to the invention, the carbon content (number of atoms) is 11 to 26 mol %, and preferably 12 to 20 mol %. If the carbon content is within the above range, the coating can be cured in a shorter time by applying ultraviolet radiation, and the mechanical strength of the resulting organic silica film can be improved while maintaining a low relative dielectric constant. If the carbon content is less than 11 mol %, the reaction is not sufficiently promoted, even if ultraviolet radiation is applied, due to the high diffusion barrier in the solid phase reaction, whereby a film exhibiting poor plasma resistance is obtained. If the carbon content exceeds 26 mol %, the mobility of the molecules is increased to a large extent, whereby a film which exhibits a low modulus of elasticity and may exhibit glass transition is obtained.

The organic silica film according to the present invention exhibits an extremely high modulus of elasticity and film density and shows a low dielectric constant, as is clear from the examples described later. In more detail, the film density of the organic silica film according to the present invention is usually 0.7 to 1.3 g/cm$^3$, preferably 0.7 to 1.2 g/cm$^3$, and still more preferably 0.7 to 1.0 g/cm$^3$. If the film density is less than 0.7 g/cm$^3$, the coating may exhibit insufficient mechanical strength. If the film density exceeds 1.3 g/cm$^3$, a low relative dielectric constant may not be obtained. The relative dielectric constant of the organic silica film according to the invention is usually 1.5 to 3.5, preferably 1.9 to 3.1, and still more preferably 2.0 to 3.0. Therefore, the organic silica film according to the invention exhibits extremely excellent insulating film characteristics such as mechanical strength and relative dielectric constant.

The organic silica film according to the invention has a contact angle of water of preferably 60° or more, and still more preferably 70° or more. This indicates that the organic silica film according to the invention is hydrophobic. Since the organic silica film exhibits low hygroscopicity, a low relative dielectric constant can be maintained. The organic silica film is rarely damaged by reactive ion etching (RIE) used in a semiconductor process due to low hygroscopicity. Moreover, the organic silica film exhibits excellent chemical resistance to a wet cleaning solution. In particular, an organic silica film with a relative dielectric constant k of 2.5 or less in which the insulating film has a porous structure significantly shows this tendency.

As described above, the organic silica film according to the invention has characteristics such as (a) exhibiting excellent insulating film characteristics such as relative dielectric constant, modulus of elasticity, plasma resistance, and chemical resistance and being able to be formed at a low temperature in a short time since the silicon compound has a specific composition and carbon content, (b) containing no contaminants for semiconductor devices since the film-forming composition according to the invention used to form the coating does not contain a source of an ionic substance, charge carrier, or corrosive compound such as a UV-active acid generator, base generator, and sensitizer, (c) allowing a curing method to be employed which damages a transistor structure formed by a semiconductor process such as RIE to only a small extent and is carried out by a single-wafer process, (d) capable of maintaining a low relative dielectric constant due to high hydrophobicity and low hygroscopicity, and (e) exhibiting excellent mechanical strength such as modulus of elasticity to withstand formation of a copper damascene structure. The above characteristics provide excellent insulating properties, coating uniformity, dielectric constant properties, modulus of elasticity of the coating, adhesion of the coating, plasma resistance, and chemical resistance.

Since the organic silica film according to the invention exhibits a low relative dielectric constant and excellent mechanical strength, adhesion, plasma resistance, and chemical resistance, the organic silica film according to the invention may be suitably used for applications such as an interlayer dielectric for semiconductor devices such as an LSI, system LSI, DRAM, SDRAM, RDRAM, and D-RDRAM, an etching stopper film, a protective film (e.g. surface coating film) for semiconductor devices, an intermediate layer used in a semiconductor manufacturing step using a multilayer resist, an interlayer dielectric for multilayer wiring boards, and a protective film or an insulating film for liquid crystal display elements. The organic silica film according to the invention may be suitably used for semiconductor devices including a wiring structure such as a copper damascene wiring structure.

2. EXAMPLE

The invention is described below in more detail by way of examples. Note that the invention is not limited to the following examples. In the examples and comparative examples, "part" and "%" respectively refer to "part by weight" and "wt %" unless otherwise indicated.

2.1. Evaluation Method

Each item was evaluated as follows.
2.1.1. Weight Average Molecular Weight (Mw) of Polymer
The weight average molecular weight (Mw) of the polymer was measured by gel permeation chromatography (GPC) under the following conditions.
Sample: A sample was prepared by dissolving 1 g of the polymer in 100 cc of tetrahydrofuran (solvent).
Standard polystyrene: Standard polystyrene manufactured by Pressure Chemical Company was used.
Instrument: high-temperature high-speed gel permeation chromatogram (Model 150-C ALC/GPC) manufactured by Waters Corporation
Column: SHODEX A-80M (length: 50 cm) manufactured by Showa Denko K.K.
Measurement temperature: 40° C.
Flow rate: 1 cc/min
2.1.2. Relative Dielectric Constant
An aluminum electrode pattern was formed on the resulting polymer film by deposition to prepare a relative dielectric constant measurement sample. The relative dielectric constant of the sample was measured at room temperature by a CV method at a frequency of 100 kHz using an electrode HP16451B and a precision LCR meter HP4284A manufactured by Yokogawa-Hewlett-Packard, Ltd.
2.1.3 Delta k
The relative dielectric constant was measured at 200° C. in the same manner as in 2.1.2, and the difference between the measured relative dielectric constant and the relative dielectric constant measured in 2.1.2 was calculated.
2.1.4. Mechanical Strength (Modulus of Elasticity)
The mechanical strength of the resulting polymer was measured using a surface acoustic wave (SAW) method.
2.1.5. Plasma Resistance Measurement Method
After applying ammonia plasma to the cured organic silica film for 30 seconds, the relative dielectric constant of the film was measured. The film was evaluated according to an increase in the relative dielectric constant due to application of plasma.
A: The increase in the relative dielectric constant was less than 0.2.
B: The increase in the relative dielectric constant was 0.2 or more and less than 0.5.
C: The increase in the relative dielectric constant was 0.5 or more.

2.1.6 Chemical Resistance Test
The cured organic silica film was immersed in a triethanolamine aqueous solution (12 pH) for ten minutes at room temperature, and washed with water. After drying waterdrops on the surface using a nitrogen blow, the relative dielectric constant of the film was measured. The film was evaluated according to an increase in the relative dielectric constant due to the test.
A: The increase in the relative dielectric constant was less than 0.1.
B: The increase in the relative dielectric constant was 0.1 or more and less than 0.3.
C: The increase in the relative dielectric constant was 0.3 or more.
2.1.7. Carbon Content
In each synthesis example, the carbon content in a hydrolysis-condensation product obtained when silane monomers used to synthesize a silicon compound (hydrolysis-condensation product) were completely hydrolyzed and condensed was calculated.
2.2. Examples and Comparative Examples
2.2.1. Synthesis Example 1
In a separable flask made of quartz, 3.14 g of a polycarbosilane A1 (weight average molecular weight: 800) having a structural unit of the following formula (4), 23.10 g of methyltrimethoxysilane, 15.14 g of tetraethoxysilane, and 2.00 g of a 40% methylamine aqueous solution were dissolved in 327.72 g of ethanol. The mixture was stirred using a three-one motor, and the solution temperature was stabilized at 55° C. A mixed solution of 60.76 g of ion-exchanged water and 268.13 g of ethanol was added to the solution in one hour.
After allowing the mixture to react at 55° C. for four hours, 17.81 g of a 20% propylene glycol monopropyl ether solution of acetic acid was added to the mixture. After allowing the mixture to react for 30 minutes, the reaction liquid was cooled to room temperature. After the addition of 656.61 g of propylene glycol monopropyl ether to the reaction liquid, the reaction liquid was concentrated under reduced pressure until the solid content became 10% to obtain a film-forming composition A. The film-forming composition (hereinafter may be simply called "composition") had a carbon content of 13.58 mol %, a weight average molecular weight of 45,000, and an Si—CH$_2$—Si/Si—O—Si ratio (molar ratio) of 0.070.

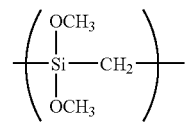

(4)

2.2.2. Synthesis Example 2
In a separable flask made of quartz, 12.55 g of the polycarbosilane A1 used in Synthesis Example 1, 17.41 g of methyltrimethoxysilane, 8.45 g of tetrapropoxysilane, and 15.30 g of 20% tetrapropylammonium hydroxide were dissolved in 259.74 g of ethanol. The mixture was stirred using a three-one motor, and the solution temperature was stabilized at 55° C. A mixed solution of 50.2 g of ion-exchanged water and 317.46 g of ethanol was added to the solution in one hour.
After allowing the mixture to react at 55° C. for four hours, 10.39 g of a 20% propylene glycol monopropyl ether solution of acetic acid was added to the mixture. After allowing the mixture to react for 30 minutes, the reaction liquid was cooled to room temperature. After the addition of 646.29 g of propylene glycol monopropyl ether to the reaction liquid, the reaction liquid was concentrated under reduced pressure until the solid content became 10% to obtain a film-forming composition B. The composition had a carbon content of 16.24 mol %, a weight average molecular weight of 42,000, and an Si—CH$_2$—Si/Si—O—Si ratio (molar ratio) of 0.320.

2.2.3. Synthesis Example 3

In a separable flask made of quartz, 31.72 g of a polycarbosilane A2 (weight average molecular weight: 750) having a structural unit (m:n=2:3) of the following formula (5), 11.61 g of methyltrimethoxysilane, and 3.24 g of tetramethoxysilane were dissolved in 639.78 g of a propylene glycol monoethyl ether solution. The mixture was stirred using a three-one motor, and the solution temperature was stabilized at 55° C. Then, 13.58 g of ion-exchanged water, in which 0.076 g of oxalic acid was dissolved, was added to the solution in one hour. After allowing the mixture to react at 50° C. for three hours, the reaction liquid was cooled to room temperature. After the addition of 653.06 g of propylene glycol monoethyl ether to the reaction liquid, the reaction liquid was concentrated under reduced pressure until the solid content became 10% to obtain a film-forming composition C. The composition had a carbon content of 23.17 mol %, a weight average molecular weight of 3200, and an Si—CH$_2$—Si/Si—O—Si ratio (molar ratio) of 1.607.

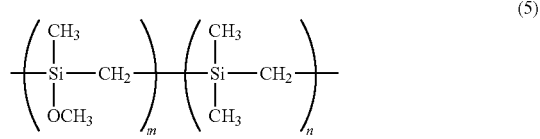

(5)

2.2.4. Synthesis Example 4

In a separable flask made of quartz, 47.37 g of a polycarbosilane A3 (weight average molecular weight: 860) having a structural unit of the following formula (6) was dissolved in 638.02 g of a propylene glycol monoethyl ether solution. The mixture was stirred using a three-one motor, and the solution temperature was stabilized at 55° C. Then, 14.52 g of ion-exchanged water, in which 0.08 g of oxalic acid was dissolved, was added to the solution in one hour. After allowing the mixture to react at 50° C. for three hours, the reaction liquid was cooled to room temperature. After the addition of 652.22 g of propylene glycol monoethyl ether to the reaction liquid, the reaction liquid was concentrated under reduced pressure until the solid content became 10% to obtain a film-forming composition D. The composition had a carbon content of 23.53 mol %, a weight average molecular weight of 2700, and an Si—CH$_2$—Si/Si—O—Si ratio (molar ratio) of 2.00.

(6)

2.2.5. Synthesis Example 5

In a separable flask made of quartz, 25.07 g of methyltrimethoxysilane, 16.82 g of tetraethoxysilane, and 2.07 g of a 40% methylamine aqueous solution were dissolved in 266.69 g of ethanol. The mixture was stirred using a three-one motor, and the solution temperature was stabilized at 55° C. A mixed solution of 62.79 g of ion-exchanged water and 388.75 g of ethanol was added to the solution in one hour.

After allowing the mixture to react at 55° C. for four hours, 18.40 g of a 20% propylene glycol monopropyl ether solution of acetic acid was added to the mixture. After allowing the mixture to react for 30 minutes, the reaction liquid was cooled to room temperature. After the addition of 655.44 g of propylene glycol monopropyl ether to the reaction liquid, the reaction liquid was concentrated under reduced pressure until the solid content became 10% to obtain a film-forming composition E. The composition had a carbon content of 12.84 mol %, a weight average molecular weight of 45,000, and an Si—CH$_2$—Si/Si—O—Si ratio (molar ratio) of 0.000.

2.2.6. Synthesis Example 6

In a separable flask made of quartz, 35.68 g of the polycarbosilane A2 used in Synthesis Example 3, 5.80 g of methyltrimethoxysilane, and 1.62 g of tetramethoxysilane were dissolved in 647.32 g of a propylene glycol monoethyl ether solution. The mixture was stirred using a three-one motor, and the solution temperature was stabilized at 55° C. Then, 9.51 g of ion-exchanged water, in which 0.052 g of oxalic acid was dissolved, was added to the solution in one hour. After allowing the mixture to react at 60° C. for 12 hours, the reaction liquid was cooled to room temperature. After the addition of 653.06 g of propylene glycol monoethyl ether to the reaction liquid, the reaction liquid was concentrated under reduced pressure until the solid content became 10% to obtain a film-forming composition F. The composition had a carbon content of 23.88 mol %, a weight average molecular weight of 4400, and an Si—CH$_2$—Si/Si—O—Si ratio (molar ratio) of 2.580.

2.2.7. Synthesis Example 7

In a separable flask made of quartz, 4.74 g of the polycarbosilane A3 used in Synthesis Example 4, 20.70 g of methyltrimethoxysilane, and 53.97 g of tetramethoxysilane were dissolved in 568.21 g of a propylene glycol monoethyl ether solution. The mixture was stirred using a three-one motor, and the solution temperature was stabilized at 55° C. Then, 52.10 g of ion-exchanged water, in which 0.090 g of oxalic acid was dissolved, was added to the solution in one hour. After allowing the mixture to react at 60° C. for 12 hours, the reaction liquid was cooled to room temperature. After the addition of 619.15 g of propylene glycol monoethyl ether to the reaction liquid, the reaction liquid was concentrated under reduced pressure until the solid content became 10% to obtain a film-forming composition G. The composition had a carbon content of 10.34 mol %, a weight average molecular weight of 4400, and an Si—CH$_2$—Si/Si—O—Si ratio (molar ratio) of 0.056.

2.3. Examples and Comparative Examples

Each of the compositions obtained in Synthesis Examples 1 to 7 was applied to a silicon wafer by spin coating. The substrate was dried on a hot plate at 90° C. for one minute and at 200° C. for one minute in a nitrogen atmosphere, and sintered under the curing conditions shown in Table 1. The resulting polymer film (hereinafter called "silica film") was evaluated according to the above evaluation methods. The evaluation results are shown in Table 1.

As the ultraviolet source, white ultraviolet radiation (ultraviolet radiation 1) including a wavelength of 250 nm or less was used. The partial pressure of oxygen when applying ultraviolet radiation was 0.01 kPa or less. Since the ultraviolet radiation 1 is white ultraviolet light, the luminance could not be measured by an effective method.

In the curing treatment in Examples 1 to 7 and Comparative Example 7, the coating was heated while applying the ultraviolet radiation 1. In Comparative Examples 1 to 6, the silica film was obtained by curing the coating by heating at 400° C. for 60 minutes without applying ultraviolet radiation.

TABLE 1

| | Composition | Curing method | Heating method Temperature (°C.) | Time (min) | Film characteristics Relative dielectric constant | Delta k | Modulus of elasticity (Gpa) | Plasma resistance | Chemical resistance |
|---|---|---|---|---|---|---|---|---|---|
| Example 1 | A | Ultraviolet radiation 1 | 350 | 5 | 2.27 | 0.08 | 5.8 | A | A |
| Example 2 | B | Ultraviolet radiation 1 | 350 | 5 | 2.31 | 0.10 | 5.2 | A | A |
| Example 3 | C | Ultraviolet radiation 1 | 350 | 5 | 2.87 | 0.12 | 11.1 | A | A |
| Example 4 | D | Ultraviolet radiation 1 | 350 | 5 | 2.93 | 0.13 | 13.2 | A | A |
| Example 5 | F | Ultraviolet radiation 1 | 350 | 5 | 3.02 | 0.13 | 6.4 | A | A |
| Example 6 | G | Ultraviolet radiation 1 | 350 | 5 | 3.03 | 0.15 | 8.7 | A | A |
| Example 7 | A | Ultraviolet radiation 1 | 400 | 3 | 2.25 | 0.06 | 6.2 | A | A |
| Comparative Example 1 | A | Thermal curing | 400 | 60 | 2.33 | 0.12 | 3.9 | B | B |
| Comparative Example 2 | B | Thermal curing | 400 | 60 | 2.37 | 0.20 | 3.5 | B | B |
| Comparative Example 3 | C | Thermal curing | 400 | 60 | 3.21 | 0.28 | 5.6 | C | B |
| Comparative Example 4 | D | Thermal curing | 400 | 60 | 3.44 | 0.34 | 6.8 | C | C |
| Comparative Example 5 | F | Thermal curing | 400 | 60 | 3.47 | 0.32 | 4.7 | C | B |
| Comparative Example 6 | G | Thermal curing | 400 | 60 | 3.38 | 0.29 | 5.5 | C | C |
| Comparative Example 7 | E | Ultraviolet radiation 1 | 350 | 5 | 2.31 | 0.10 | 3.8 | B | C |

In Examples 1 to 6, in which the coating was cured by applying the ultraviolet radiation 1, a silica film exhibiting a low Delta k, a high modulus of elasticity, and excellent plasma resistance and chemical resistance was obtained. In Comparative Examples 1 to 6, in which the coating was thermally cured without applying ultraviolet radiation, a silica film exhibiting a high Delta k and a low modulus of elasticity was obtained although the coating was cured at a high temperature for a long time in comparison with Examples 1 to 6. The silica films obtained in Comparative Examples 1 to 6 exhibited poor plasma resistance and chemical resistance. It is considered that the silanol groups were not sufficiently condensed to remain in the silica film as residual silanol groups.

In Example 7, in which the coating was cured by applying ultraviolet radiation at a temperature higher than that of Example 1, a silica film exhibiting a low Delta k, a high modulus of elasticity, and excellent plasma resistance and chemical resistance was obtained in a short time in comparison with Example 1.

The silica film of Comparative Example 7 was obtained by curing the composition having a carbon content of 12.84 mol % and an Si—CH$_2$—Si/Si—O—Si ratio (molar ratio) of 0.000. The silica film of Comparative Example 7 exhibited a low Delta k and a high modulus of elasticity, but exhibited poor plasma resistance and chemical resistance.

As described above, it was confirmed that a silica film with significantly improved film characteristics, plasma resistance, and chemical resistance can be formed by curing the film obtained using the composition including the silicon compound having an Si—O—Si—structure and an —Si—CH$_2$—Si—structure using ultraviolet radiation with a wavelength of 250 nm or less. Therefore, the silica film obtained according to the invention exhibits excellent mechanical strength, a low relative dielectric constant, and low hygroscopicity, and may be suitably used as an interlayer dielectric for semiconductor devices and the like.

The invention claimed is:

1. A method, comprising:

heating a coating composition present on a substrate; and irradiating said coating composition with ultraviolet radiation to cure said coating composition, wherein said coating composition comprises a silicon compound having an —Si—O—Si— structure and an —S$_1$—CH$_2$—Si— structure, the silicon compound is a hydrolysis-condensation product obtained by hydrolyzing and condensing a hydrolyzable-group-containing silane monomer in the presence of a polycarbosilane, said hydrolyzable-group-containing silane monomer comprises at least one compound selected from the group consisting of a compound represented by formula (2) and a compound represented by formula (3):

$$R^1{}_a SiX_{4-a} \qquad (2)$$

where each $R^1$ individually represents a hydrogen atom, a fluorine atom, or a monovalent organic group, each X individually represents a halogen atom, a hydroxyl group, an alkoxy group, or an acyloxy group, and a represents an integer from 0 to 3;

$$R^2{}_b Y_{3-b} Si{-}(R^4)_d{-}SiZ_{3-c}R^3{}_c \qquad (3)$$

where each $R^2$ and $R^3$ individually represents a monovalent organic group, b and c individually represent integers from 0 to 2, each $R^4$ represents an oxygen atom, a phenylene group, or a group —(CH$_2$)$_e$— where e represents an integer from 1 to 6, each Y and Z individually represents a halogen atom, a hydroxyl group, an alkoxy group, or an acyloxy group, and d represents 0 or 1;

and said polycarbosilane is a compound represented by formula (1)

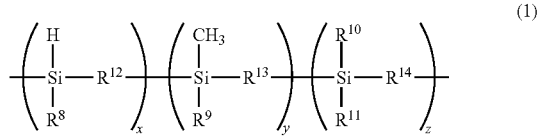

where
- each $R^8$ individually represents a hydrogen atom, a halogen atom, a hydroxyl group, an alkoxy group, an acyloxy group, a sulfone group, a methanesulfone group, a trifluoromethanesulfone group, an alkyl group, an alkenyl group, or an aryl group,
- each $R^9$ individually represents a halogen atom, a hydroxyl group, an alkoxy group, an acyloxy group, a sulfone group, a methanesulfone group, a trifluoromethanesulfone group, an alkyl group, an alkenyl group, or an aryl group,
- each $R^{10}$ and $R^{11}$ individually represents a halogen atom, a hydroxyl group, an alkoxy group, an acyloxy group, a sulfone group, a methanesulfone group, a trifluoromethanesulfone group, an alkyl group having 2 to 6 carbon atoms, an alkenyl group, or an aryl group,
- each $R^{12}$ to $R^{14}$ individually represents a methylene group, an alkylene group, an alkenylene group, or an arylene group, provided that at least one of $R^{12}$ to $R^{14}$ represents a methylene group, and
- x, y, and z individually represent integers from 0 to 10,000, provided that $5<x+y+z<10,000$ is satisfied, and when x=0, one of $R^9$, $R^{10}$, and $R^{11}$ represents a hydrogen atom, a hydroxyl group, an alkoxy group, an acyloxy group, a sulfone group, a methanesulfone group, or a trifluoromethanesulfone group.

2. The method according to claim 1, wherein said silicon compound comprises the —Si—O—Si— structure and the —S₁—CH₂—Si— structure at an —Si—CH₂—Si—/—Si—O—Si— molar ratio of from 0.025 to 2.00.

3. The method according to claim 1, wherein the silicon compound has a carbon content of from 11 to 26 mol %.

4. The method according to claim 1, wherein the wavelength of said ultraviolet radiation is 250 nm or less.

5. The method according to claim 1, wherein said heating and said irradiating are carried out at the same time.

6. The method according to claim 1, wherein said heating is carried out at a temperature of from 300 to 450° C.

7. The method according to claim 1, wherein said irradiating is carried out in the absence of oxygen.

8. The method according to claim 1, wherein the wavelength of said ultraviolet radiation is from 150 to 250 nm.

9. The method according to claim 1, wherein said irradiating is carried out at a partial pressure of oxygen of 0.1 kPa or less.

10. The method according to claim 1, wherein said irradiating is carried out at a partial pressure of oxygen of 0.01 kPa or less.

11. The method according to claim 1, wherein said irradiating is carried out in the presence of an inert gas selected from the group consisting of $N_2$, He, Ar, Kr, and Xe.

12. A coated substrate obtained by the method according to claim 1, wherein a film formed on the substrate has a relative dielectric constant of 1.5 to 3.5 and a film density of 0.7 to 1.3 g/cm³.

13. A wiring structure comprising the coated substrate according to claim 12 as an interlayer dielectric.

14. A semiconductor device comprising the wiring structure according to claim 13.

15. The coated substrate according to claim 12, wherein the thickness of said film is from 1 to 2,000 nm.

16. The coated substrate according to claim 12, wherein the thickness of said film is from 10 to 1,000 nm.

17. A method, comprising:
- hydrolyzing and condensing a hydrolyzable-group-containing silane monomer in the presence of a polycarbosilane, an organic solvent and, optionally, a catalyst, to obtain the silicon compound having a —Si—O—Si— structure and an —S₁—CH₂—Si— structure;
- dissolving the silicon compound in a solvent to obtain a coating composition;
- heating the coating composition present on a substrate; and
- irradiating the coating composition with ultraviolet radiation to cure the coating composition;

wherein
said polycarbosilane comprises a compound represented by formula (1)

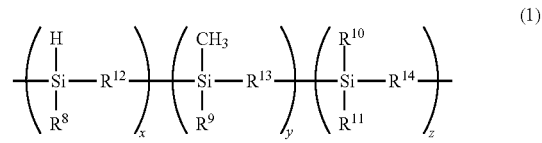

where
- each $R^8$ individually represents a hydrogen atom, a halogen atom, a hydroxyl group, an alkoxy group, an acyloxy group, a sulfone group, a methanesulfone group, a trifluoromethanesulfone group, an alkyl group, an alkenyl group, or an aryl group,
- each $R^9$ individually represents a halogen atom, a hydroxyl group, an alkoxy group, an acyloxy group, a sulfone group, a methanesulfone group, a trifluoromethanesulfone group, an alkyl group, an alkenyl group, or an aryl group,
- each $R^{10}$ and $R^{11}$ individually represents a halogen atom, a hydroxyl group, an alkoxy group, an acyloxy group, a sulfone group, a methanesulfone group, a trifluoromethanesulfone group, an alkyl group having 2 to 6 carbon atoms, an alkenyl group, or an aryl group,
- each $R^{12}$ to $R^{14}$ individually represents a methylene group, an alkylene group, an alkenylene group, or an arylene group, provided that at least one of $R^{12}$ to $R^{14}$ represents a methylene group, and
- x, y, and z individually represent integers from 0 to 10,000, provided that $5<x+y+z<10,000$ is satisfied, and when x=0, one of $R^9$, $R^{10}$, and $R^{11}$ represents a hydrogen atom, a hydroxyl group, an alkoxy group, an acyloxy group, a sulfone group, a methanesulfone group, or a trifluoromethanesulfone group.

18. The method according to claim 17, wherein the amount of the polycarbosilane is 1 to 1000 parts by weight for 100 parts by weight of the hydrolyzable-group-containing silane monomer as a complete hydrolysis-condensation product.

19. The method according to claim 17, wherein said hydrolyzing and condensing is carried out at a temperature of from 0 to 100° C. and for a period of from 1 to 8 hours.

20. The method according to claim 17, wherein said irradiating is carried out at a partial pressure of oxygen of 0.1 kPa or less.

* * * * *